(12) United States Patent
Kim

(10) Patent No.: US 8,330,888 B2
(45) Date of Patent: Dec. 11, 2012

(54) DISPLAY SUBSTRATE, METHOD OF MANUFACTURING THE SAME AND LIQUID CRYSTAL DISPLAY DEVICE HAVING THE SAME

(75) Inventor: Jae-Hyun Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 641 days.

(21) Appl. No.: 12/496,747

(22) Filed: Jul. 2, 2009

(65) Prior Publication Data
US 2010/0149448 A1   Jun. 17, 2010

(51) Int. Cl.
*G02F 1/1368* (2006.01)
(52) U.S. Cl. ............ 349/43; 349/38; 349/129; 349/143; 349/182
(58) Field of Classification Search .......... 349/38, 349/39, 42, 48, 128, 129, 130, 143, 187, 349/43, 46, 139, 144, 182; 345/92; 438/30; 257/59, 72
See application file for complete search history.

(56) References Cited

U.S. PATENT DOCUMENTS

| 7,612,839 | B2* | 11/2009 | Hisada | 349/48 |
| 2003/0206262 | A1* | 11/2003 | Kim et al. | 349/129 |
| 2004/0070713 | A1* | 4/2004 | Song | 349/129 |
| 2007/0103607 | A1* | 5/2007 | Hanaoka et al. | 349/38 |
| 2008/0018573 | A1* | 1/2008 | Hsieh et al. | 345/87 |
| 2008/0088783 | A1* | 4/2008 | Tai et al. | 349/129 |

FOREIGN PATENT DOCUMENTS

| JP | 2006-330375 A | 12/2006 |
| JP | 2008-015512 A | 1/2008 |
| KR | 1020070118809 A | 12/2007 |

* cited by examiner

*Primary Examiner* — Dung Nguyen
*Assistant Examiner* — Tai Duong
(74) *Attorney, Agent, or Firm* — Cantor Colburn LLP

(57) ABSTRACT

A display substrate includes a gate line, a data line crossing the gate line, a transistor connected to the gate line and the data line, a first pixel electrode connected to a first output electrode of the transistor and a second pixel electrode connected to a second output electrode of the transistor. The first pixel electrode includes cutting grooves which define a first domain on the first pixel electrode off-axis image quality.

18 Claims, 11 Drawing Sheets

DISPLAY SUBSTRATE, METHOD OF MANUFACTURING THE SAME AND LIQUID CRYSTAL DISPLAY DEVICE HAVING THE SAME

This application claims priority to Korean Patent Application No. 2008-126717, filed on Dec. 12, 2008, and all the benefits accruing therefrom under 35 U.S.C. § 119, the contents of which in its entirety are herein incorporated by reference.

BACKGROUND OF THE INVENTION

1. Field of the Invention

The present invention relates to a display substrate, a method of manufacturing a display substrate and a liquid crystal display ("LCD") device having the display substrate. More particularly, the present invention relates to a display substrate having substantially improved display quality, a method of manufacturing the display substrate, and an LCD device having the display substrate.

2. Description of the Related Art

Generally, a patterned vertical alignment ("PVA") mode and, more particularly, a mobile PVA ("mPVA") mode, display device, utilized in a small- or medium-size screen, applies a circular polarization mode having advantages over other modes in terms of transmissivity, for example. Alternatively, a linear polarization mode having advantages over other modes in terms of visibility and contrast ratio, for example, may be applied.

In the mPVA mode display device, slit portions are formed in both a common electrode of a color filter substrate as well as a pixel electrode of an array substrate to form a multi-domain structure for improving a viewing angle of the display device.

In the mPVA mode display device, a size of a pixel is small relative to other types of display devices, and an aperture ratio of the pixel is higher. Moreover, a director of liquid crystal typically has a maximum angle of about 45 degrees with respect to a polarization axis of a polarizer. As a result, however, a conventional compensation film cannot remove light leakage from a side surface of the mPVA mode display device. Accordingly, off-axis image quality the mPVA mode display device needs to be improved.

A polymer-stabilized vertical alignment ("PSVA") mode, in which liquid crystal molecules are controlled by a micro-slit pixel structure without patterning a common electrode of an upper substrate, has been developed. A stability of a domain may be reduced, however, since the common electrode is not patterned on the upper substrate. In attempts to solve this problem, a small amount of a reactive mesogen is added during a manufacturing process of a panel of the display device, and the mesogen moves in a same direction as the liquid crystal molecules during the manufacturing process. After the panel is manufactured, ultraviolet rays are irradiated onto the panel and the reactive mesogens are thereby polymerized. As a result, a direction is applied to the liquid crystal.

However, transmissivity is substantially reduced during the manufacturing process, due to the micro-slit pixel structure and the line polarized polarizer.

BRIEF SUMMARY OF THE INVENTION

Exemplary embodiments provide a display substrate having substantially improved off-axis image quality and transmissivity.

Exemplary embodiments also provide a method of manufacturing the display substrate.

Exemplary embodiments also provide a display device having the display substrate.

According to an exemplary embodiment, a display substrate includes a gate line, a data line crossing the gate line, a transistor connected to the gate line and the data line, a first pixel electrode connected to a first output electrode of the transistor and a second pixel electrode connected to a second output electrode of the transistor. The first pixel electrode includes cutting grooves disposed thereon to define a first domain.

In an exemplary embodiment, the gate line may be disposed between the first pixel electrode and the second pixel electrode, and the first pixel electrode and the second pixel electrode simultaneously may receive a voltage through the transistor.

In an exemplary embodiment, a peripheral area of the second pixel electrode may define a closed-loop shape. The cutting groove may be disposed in the first domain to define four groups, and the cutting grooves in a same group of the four groups may be substantially parallel with each other.

In an exemplary embodiment, the display substrate may further include a first boosting electrode overlapping the first output electrode of the transistor to define a first storage capacitor, and a second boosting electrode overlapping the second output electrode of the transistor to define a second storage capacitor.

In an exemplary embodiment, the first boosting electrode and the second boosting electrode may include a transparent material. An area of the first boosting electrode may be less than an area of the second boosting electrode. The display substrate may further include a first boosting line disposed substantially in parallel with the gate line and connected to the first boosting electrode, and a second boosting line disposed substantially in parallel with the gate line and connected to the second boosting electrode.

In an exemplary embodiment, a periphery of the first pixel electrode may be larger than a periphery of the second pixel electrode.

According to an alternative exemplary embodiment, a method of manufacturing a display substrate includes forming a transistor connected to a gate line and a data line crossing the gate line, forming a first pixel electrode connected to a first output electrode of the transistor, and forming a second pixel electrode connected to a second output electrode of the transistor. The first pixel electrode includes cutting grooves formed thereon to define a first domain.

In an exemplary embodiment, the method may further include forming a first boosting line and a second boosting line boosting the first pixel electrode and the second pixel electrode, respectively, forming the gate line and a gate electrode of the transistor by patterning a first metal layer deposited on a base substrate, and forming a first boosting electrode and a second boosting electrode connected to the first boosting line and the second boosting line, respectively, by patterning a transparent metal layer deposited on the base substrate on which the first boosting line, the second boosting line, the gate electrode and the gate line are formed. An area of the first boosting electrode may be less than an area of the second boosting electrode.

According to another alternative exemplary embodiment, a display device includes a display substrate, an opposite substrate and a liquid crystal layer. The display substrate includes a gate line, a data line crossing the gate line, a transistor connected to the gate line and the data line, a first pixel electrode connected to a first output electrode of the transistor, the first pixel electrode having cutting grooves disposed thereon for defining a first domain, and a second pixel electrode connected to a second output electrode of the transistor. The opposite substrate faces the display substrate, and includes a common electrode. The liquid crystal layer is interposed between the display substrate and the opposite substrate.

In an exemplary embodiment, the display device may further include a first boosting electrode which forms the first output electrode of the transistor and a first storage capacitor, and a second boosting electrode which forms the second output electrode of the transistor and a second boosting electrode.

In an exemplary embodiment, the first pixel electrode and the second pixel electrode may include a first contact hole and a second contact hole, respectively, electrically connected to the first output electrode and the second output electrode, respectively. The opposite substrate may include a common electrode having a first common electrode hole and a second common electrode hole formed therethrough and corresponding to the first pixel electrode and the second pixel electrode, respectively. The first contact hole and the second contact hole may be disposed to overlap the first common electrode hole and the second common electrode hole, respectively.

In an exemplary embodiment, the opposite substrate may include a common electrode having a common electrode hole formed therethrough and corresponding to the second pixel electrode. The second contact hole may be disposed to overlap the common electrode hole. The liquid crystal layer may include a reactive mesogen.

According to still another alternative exemplary embodiment, a display device includes a display substrate, an opposite substrate and a liquid crystal layer. The display substrate includes a gate line, a data line crossing the gate line, a transistor connected to the gate line and the data line, a pixel electrode connected to the transistor and having cutting grooves disposed thereon for defining a pixel area. The opposite substrate faces the display substrate, and includes a common electrode. The liquid crystal layer is interposed between the display substrate and the opposite substrate.

Thus, according to exemplary embodiments, in a display substrate, a method of manufacturing the display substrate and a display device having the display substrate, off-axis image quality is substantially improved with respect to a circular polarization mPVA mode, and transmissivity is substantially enhanced using a circular polarizer. Moreover, a first pixel electrode and a second pixel electrode utilize dual gamma driving through a first boosting signal and a second boosting signal, respectively, and off-axis image quality is further improved.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
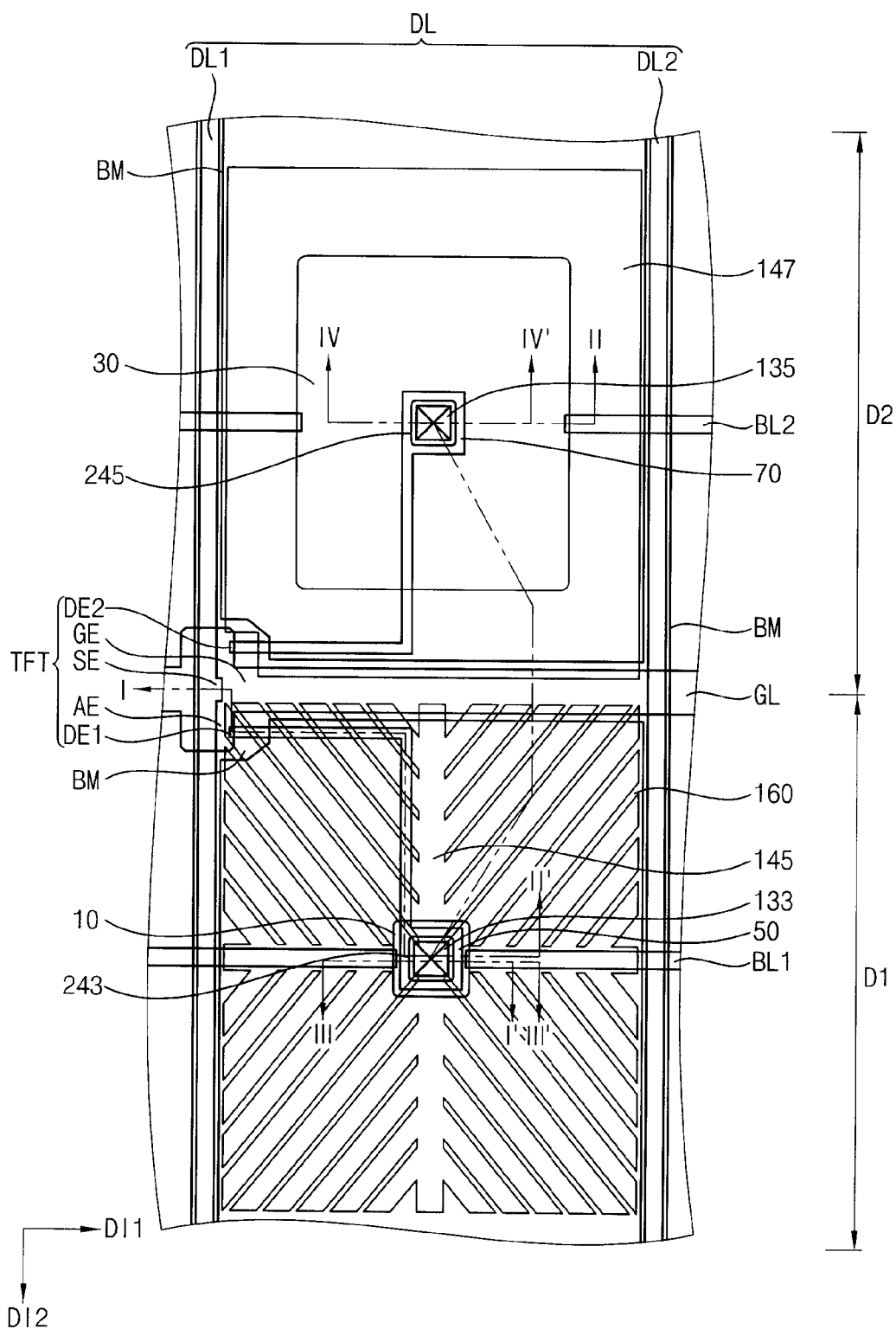
FIG. 1 is a plan view of an exemplary embodiment of a display device according to the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments will be described in further detail with reference to the accompanying drawings.

Figure 2:
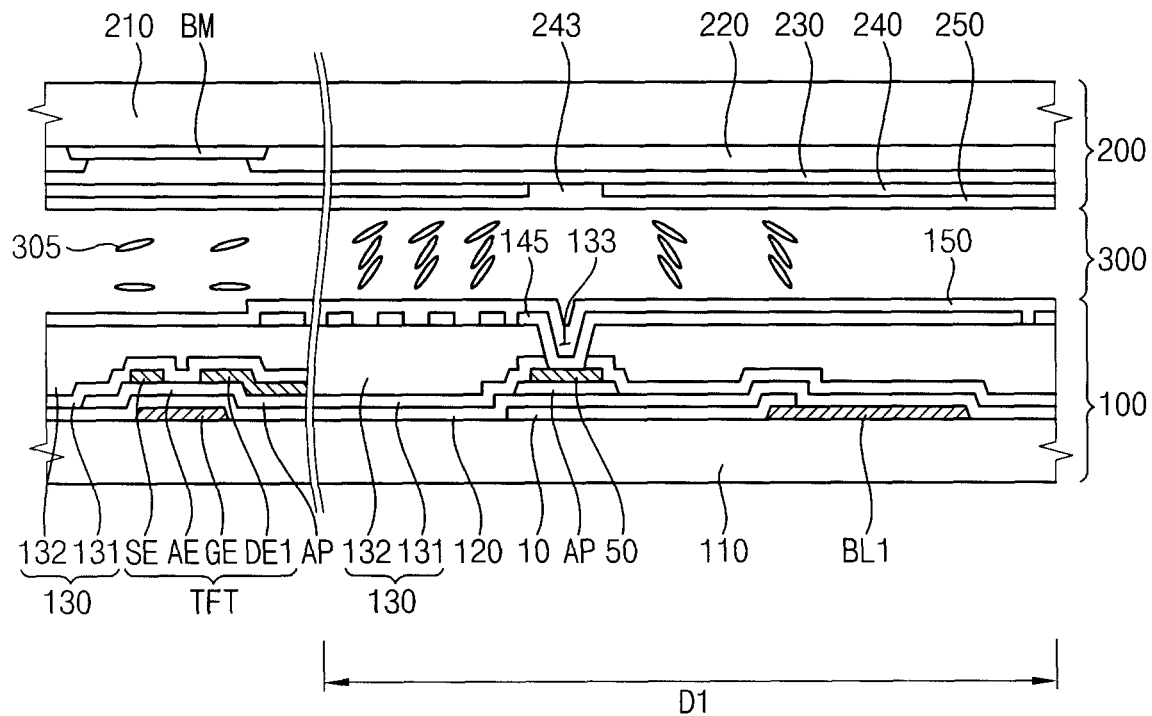
FIG. 2 is a partial cross-sectional view taken along line I-I' of FIG. 1.
Figure 3:
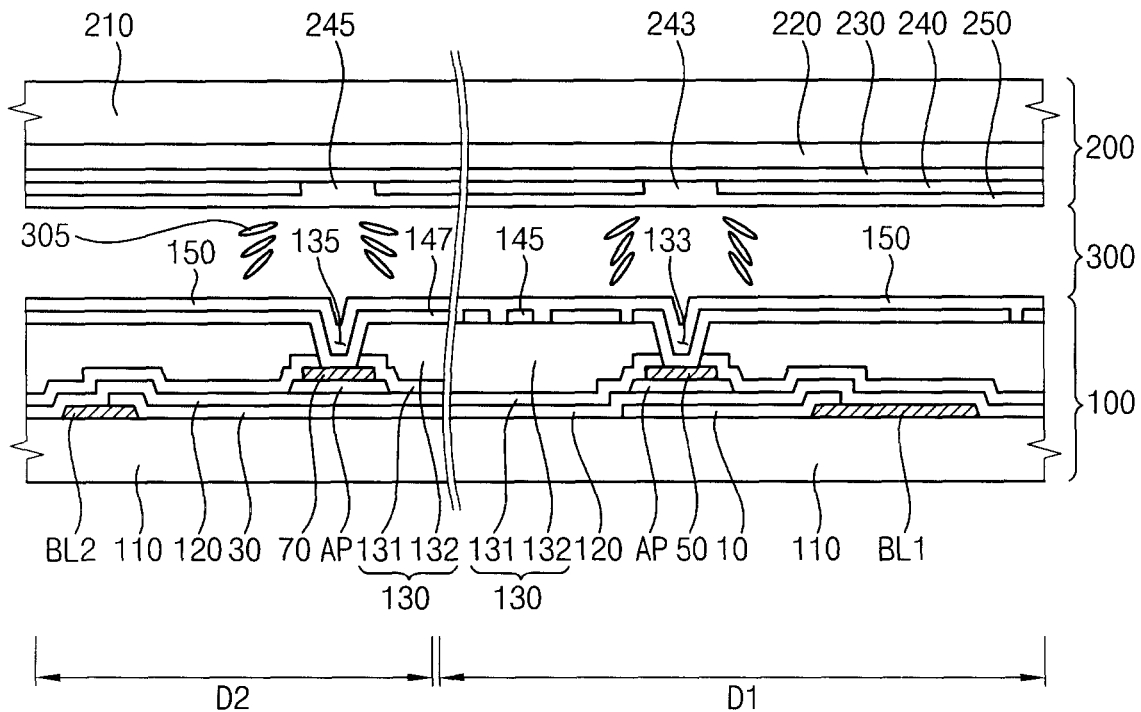
FIG. 3 is a partial cross-sectional view taken along line II-II' of FIG. 1.

FIG. 1 is a plan view illustrating an exemplary embodiment of a display device according to the present invention. FIG. 2 is a partial cross-sectional view taken along line I-I' of FIG. 1. FIG. 3 is a partial cross-sectional view taken along a line II-II' of FIG. 1.

Referring to FIGS. 1 to 3, a display device according to an exemplary embodiment includes a display substrate 100, an opposite substrate 200 and a liquid crystal layer 300.

The display substrate 100 may include a base substrate 110 having a pixel area defined thereon. A gate line GL, a first boosting line BL1, a second boosting line BL2, a first boosting electrode 10, a second boosting electrode 30, a gate insulation layer 120, data lines DL including a first data line DL1 and a second data line DL2, a data insulation layer 130, a first contact electrode 50, a second contact electrode 70, a first pixel electrode 145, a second pixel electrode 147, a transistor TFT and a lower alignment layer 150 are disposed on the first base substrate 110.

The first base substrate 110 may have a substantially plate shape, e.g., a substantially rectilinear shape. The first base substrate 110 may include a transparent material such as glass, quartz and/or synthetic resin, for example.

The gate line GL may be disposed on the base substrate 110 and extend along a first direction DI1. The gate line GL may be disposed between the first pixel electrode 145 and the second pixel electrode 147.

The first boosting line BL1 and the second boosting line BL2 extend along the first direction DI1 and cross center portions of the first pixel electrode 145 and the second pixel electrode 147, respectively.

The first boosting electrode 10 and the second boosting electrode 30 overlap portions of the first boosting line BL1 and the second boosting line BL2, respectively, and are disposed on the base substrate 110. The first boosting electrode 10 and the second boosting electrode 30 include a transparent metal pattern, and transmissivity is thereby substantially improved.

A gate insulation layer 120 is disposed on the first base substrate 110 to cover at least a portion of the gate line GL, the first boosting line BL1 and the second boosting line BL2, and the first boosting electrode 10 and the second boosting electrode 30.

The first data line DL1 and the second data line DL2 are disposed on the gate insulation layer 120 and extend in a second direction DI2 crossing the first direction DI1. In an exemplary embodiment, the first direction DI1 and the second direction DI2 may be substantially perpendicular to each other.

The transistor TFT includes a gate electrode GE, an active electrode AE, a source electrode SE, a first drain electrode DE1 and a second drain electrode DE2. The transistor TFT simultaneously applies a voltage to the first pixel electrode 145 and the second pixel electrode 147.

The gate electrode GE may be a portion of the gate line GL. The active electrode AE may be disposed on the gate insulation layer 120 to overlap the gate electrode GE.

The source electrode SE may diverge from, e.g., project from, the data line DL.

The first drain electrode DE1 may be spaced apart from the second drain electrode DE2. The first drain electrode DE1 may be spaced apart from the source electrode SE.

The first drain electrode DE1 is extended to electrically connect to the first contact electrode 50, and is disposed to overlap the first boosting electrode 10. Accordingly, transmissivity is thereby substantially improved.

The second drain electrode DE2 extends to connect to the second contact electrode 70, and overlaps the second boosting electrode 30. As a result, transmissivity is thereby further improved.

The first contact electrode 50 and the second contact electrode 70 are disposed on the gate insulation layer 120 within a unit pixel. The first contact electrode 50 and the second contact electrode 70 may be a substantially rectangular shape when viewed from a plan view of the display substrate, as shown in FIG. 1.

The data insulation layer 130 is disposed on the gate insulation layer 120 to cover the first data line DL1 and the second data line DL2, the source electrode SE and first drain electrode DE1 and the second drain electrode DE2, the first contact electrode 50 and the second contact electrode 70. In an exemplary embodiment, the data insulation layer 130 may include an inorganic insulation layer 131 and an organic insulation layer 132. Moreover, the inorganic insulation layer 131 covers the organic insulation layer 132, as shown in FIG. 1.

A first contact hole 133 is formed through the data insulation layer 130 to correspond to an upper portion of the contract electrode 50, and a second contact hole 135 is formed through the data insulation layer 130 to correspond to an upper portion of the second contact electrode 70.

The first pixel electrode 145 and the second pixel electrode 147 may be disposed on the data insulation layer 130. The first pixel electrode 145 and the second pixel electrode 147 may include a metal pattern from a transparent metal layer.

The first pixel electrode 145 may contact the first contact electrode 50 extending from the first drain electrode DE1 of the transistor TFT, and may include a plurality of cutting grooves 160 which define a first domain D1.

The second pixel electrode 147 contacts the second contact electrode 70 extending from the second drain electrode DE2 of the transistor TFT. A second domain D2 is defined corresponding to the second pixel electrode 147. In addition, a peripheral area of the second pixel electrode 147 may include a closed-loop shape, e.g., a substantially rectilinear shape without protrusions extending outward from sides thereof. In contrast, the cutting grooves 160 of the first pixel electrode 145 extend outward from the first pixel electrode 145 to form openings about a peripheral area thereof, as shown in FIG. 1.

Cutting grooves 160 of the plurality of cutting grooves 160 of the first pixel electrode 145 may be disposed in the first domain D1 area, and may define four sub-domains in the first domain D1 area. The cutting grooves 160 may be disposed substantially in parallel with each other in each sub-domain of the four sub-domains, as shown in FIG. 1. Accordingly, a remaining area of the first pixel electrode 145, e.g., an area excluding the cutting grooves 160, may include a shape in which slits are arranged.

A periphery, e.g., a peripheral size, of the first pixel electrode 145 may be larger than a periphery, e.g., a peripheral size, of the second pixel electrode 147, as shown in FIG. 1. More particularly, a rectangle, defined by an outermost periphery of the first pixel electrode 145 may be larger than a rectangle, defined by an outermost periphery of the second pixel electrode 147. However, an effective area, e.g., an area of the first pixel electrode 145 on the data insulation layer, may be less than an area of the second pixel electrode 147 on the data insulation layer.

Therefore, since patterns, e.g., shapes, of the first pixel electrode 145 and the second pixel electrode 146 are different from each other, transmissivity is substantially increased and off-axis image quality is substantially improved.

The lower alignment layer 150 may be disposed on the first base substrate 110 having the first pixel electrode 145 and the second pixel electrode 147 disposed thereon. Liquid crystal molecules 305 of the liquid crystal layer 300 may be aligned in a substantially vertical direction, e.g., in a direction inclined toward an opposite substrate 200 from the display substrate 100.

The opposite substrate 200 may face the display substrate 100.

The opposite substrate 200 may include an upper substrate 210, a light-blocking pattern BM, e.g., a black matrix pattern BM, a color filter pattern 220, an overcoating layer 230, a common electrode 240 and upper alignment layer 250.

The light-blocking pattern BM may be disposed on the upper substrate 210 corresponding to the first data line DL1 and the second data line DL2 and the transistor TFT. Accordingly, the color filter pattern 220 may be disposed on a pixel area in which light passage therethrough is not blocked.

The color filter pattern 220 may include, for example, a red filter, a green filter and a blue filter. The overcoating layer 230 may cover the color filter pattern 220 and the light-blocking pattern BM.

The common electrode 240 may be disposed on the overcoating layer 230. The common electrode 240 may include a first common electrode hole 243 and a second common electrode hole 245 corresponding to the first contact hole 133 and the second contact hole 135, respectively. When an electric field is applied, the liquid crystal molecules 305 of the liquid crystal layer 300 may be aligned toward the first common electrode hole 243 and the second common electrode hole 245 by the first common electrode hole 243 and the second common electrode hole 245.

In this case, the first common electrode hole 243 and the second common electrode hole 245 may be disposed in a center portion of the pixel area and have a substantially rectangular shape. Alternatively, the first common electrode hole 243 and the second common electrode hole 245 may have a cross shape, a circular shape and a cross shape inclined at an angle of about 45 degrees, for example, but alternative exemplary embodiments are not limited thereto.

The upper alignment layer 250 may be disposed on the common electrode 240 to vertically align liquid crystal molecules 305 in the liquid crystal layer 300.

The liquid crystal layer 300 is interposed between the display substrate 100 and the opposite substrate 200. An arrangement, e.g., an alignment, the of liquid crystal molecules 305 in the liquid crystal layer 300 is changed by an electric field formed between each of the first pixel electrode 145 and the second pixel electrode 145 and the common electrode 240. As a result, a light transmissivity of the liquid crystal layer 300 is changed based on a strength of the electric field.

Figure 4:
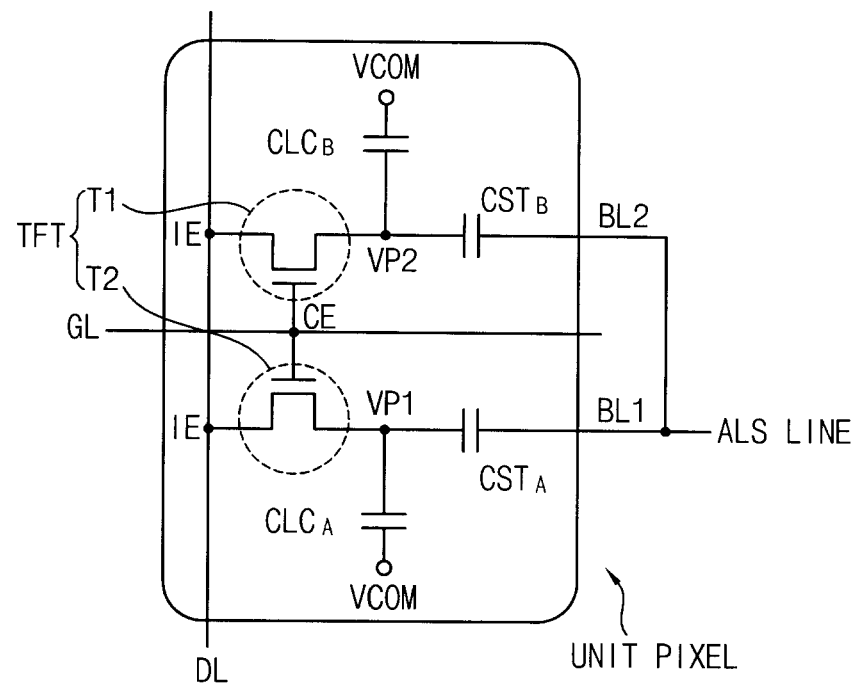
FIG. 4 is a schematic circuit diagram of an exemplary embodiment of a unit pixel of the display device shown in FIG. 1.
Figure 5A:
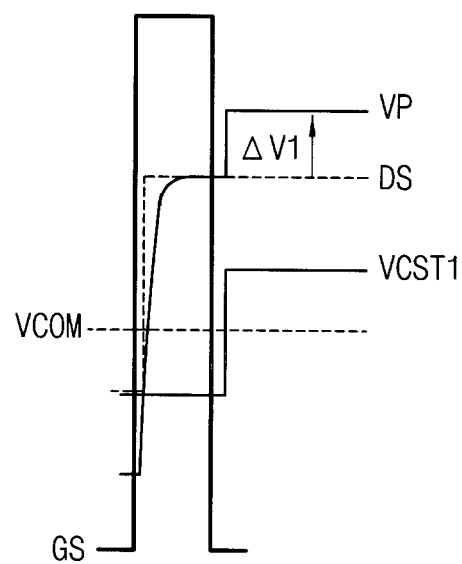
FIG. 5A is a signal timing diagram illustrating an exemplary embodiment of a first pixel voltage corresponding to a first pixel electrode of the unit pixel shown in FIG. 4.
Figure 5B:
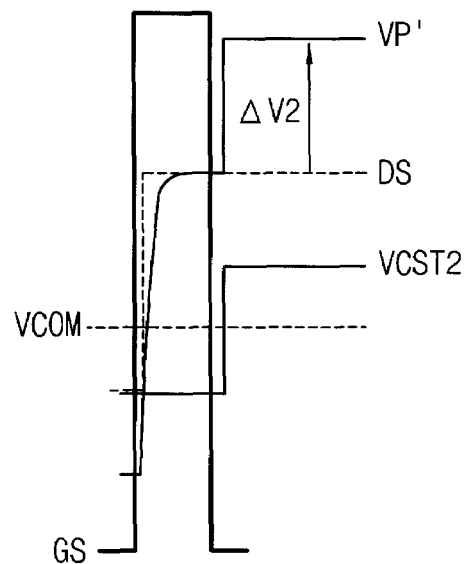
FIG. 5B is a signal timing diagram illustrating an exemplary embodiment of a second pixel voltage corresponding to a second pixel electrode of the unit pixel shown in FIG. 4.

FIG. 4 is a schematic circuit diagram of a unit pixel of the display device shown in FIG. 1. FIG. 5A is a signal timing diagram illustrating an exemplary embodiment of a first pixel voltage corresponding to a first pixel electrode of the unit pixel shown in FIG. 4. FIG. 5B is a signal timing diagram illustrating an exemplary embodiment of a second pixel voltage corresponding to a second pixel electrode of the unit pixel shown in FIG. 4.

Referring to FIGS. 1 to 5B, a data signal DS may be applied to an input electrode IE of a first switching element T1 and a second switching element T2 of the transistor TFT through the data line DL. A gate signal GS may be applied to a control electrode CE of the first switching element T1 and the second switching element T2 through the gate line GL.

The data signal DS applied to the input electrode IE may be outputted to the first output electrode VP1 and second output electrode VP2.

A first storage capacitor $CST_A$ may include the first boosting electrode 10 contacting with the first boosting line BL1, the gate insulation layer 120, the active pattern AP and the first contact electrode 50. In an exemplary embodiment, the first contact electrode 50 may be connected to the first drain electrode DE1. Accordingly, the first contact electrode 50 represents the first output electrode VP1.

A capacitance of the first storage capacitor $CST_A$ may be increased by the first boosting electrode 10, the gate insulation layer 120, the active pattern AP and the first pixel electrode 145. Accordingly, a size of the first contact electrode 50, formed from an opaque metal material, may be decreased, and transmissivity is thereby substantially improved.

A second storage capacitor $CST_B$ may include the second boosting electrode 30 in contact with the second boosting line BL2, the gate insulation layer 120, the active pattern AP and the second contact electrode 70. In addition, the second contact electrode 70 may be connected to the second drain electrode DE2. Accordingly, the second contact electrode 70 represents the second output electrode VP2.

A capacitance of the second storage capacitor $CST_B$ may be increased by the second boosting electrode 30, the gate insulation layer 120, the active pattern AP and the second pixel electrode 147. Accordingly, a size of the second contact electrode 70, formed from an opaque metal material, may be decreased, and transmissivity is thereby substantially improved.

When a first boosting signal VCST1 applied to the first boosting line BL1 is controlled, a voltage level of a data signal DS, applied to the first output electrode VP1 by the first storage capacitor $CST_A$, is boosted to a first pixel voltage VP which is a voltage applied to the first pixel electrode 145.

When a second boosting signal VCST2 applied to the second boosting line BL2 is controlled, a voltage level of the data signal DS, applied to the second output electrode VP2 by the second storage capacitor $CST_B$, is boosted to a second pixel voltage VP' which is a voltage applied to the second pixel electrode 147.

In an exemplary embodiment, the first boosting line BL1 and the second boosting line BL2 may be a same boosting line ALS LINE.

In an exemplary embodiment, the first pixel voltage VP and the second pixel voltage VP' applied by the first boosting line BL1 and the second boosting line BL2, respectively, are defined by Equations 1 and 2:

$$VP = Vd \pm \Delta V1 = (Vd) \pm \frac{CST_A}{(CST_A + CLC_A)}(Vh - Vl) \quad \text{[Equation 1]}$$

$$VP' = Vd \pm \Delta V2 = (Vd) \pm \frac{CST_B}{(CST_B + CLC_B)}(Vh' - Vl') \quad \text{[Equation 2]}$$

In Equations 1 and 2, Vd denotes a data voltage applied by the data line DL. $\Delta$V1 denotes a first difference voltage of the first pixel voltage VP, changed by coupling, when a level of the first boosting line BL1 is changed. $\Delta$V2 denotes a second difference voltage of the second pixel voltage VP', changed by coupling, when a level of the second boosting line BL2 is changed. $CST_A$ denotes a capacitance of the first storage capacitor $CST_A$ formed by overlapping the gate insulation layer 120 between the first boosting electrode 10 and the first contact electrode 50. $CST_B$ denotes a capacitance of the second storage capacitor $CST_B$ formed by overlapping the gate insulation layer 120 formed between the second boosting electrode 30 and the second contact electrode 70. $CLC_A$ denotes a capacitance of a liquid crystal capacitor being formed in correspondence with the first pixel electrode 145. $CLC_B$ denotes a capacitance of a liquid crystal capacitor being disposed corresponding to the second pixel electrode 147. Vh and Vh' denote high voltage levels of first boosting signal VCST1 and the second boosting signal VCST2, respectively. Vl and Vl' denote low voltage levels of first boosting signal VCST1 and the second boosting signal VCST2, respectively.

As shown in Equations 1 and 2, in an exemplary embodiment, capacitances of the first storage capacitor $CST_A$ and the second storage capacitor $CST_B$ are different from each other. Thus, a first kickback voltage, corresponding to the first pixel electrode 145, and a second kickback voltage corresponding to the second pixel electrode 147, are different from each other. Specifically, the first kickback voltage and the second kickback voltage are defined by Equations 3 and 4:

$$\Delta VK1 = \frac{CGS_A}{(CLC_A + CST_A + CGS_A)} \quad \text{[Equation 3]}$$

$$\Delta VK2 = \frac{CGS_B}{(CLC_B + CST_B + CGS_B)} \quad \text{[Equation 4]}$$

In Equations 3 and 4, $\Delta$Vk1 denotes the first kickback voltage corresponding to the first pixel electrode 145. $\Delta$Vk2 denotes the second kickback voltage corresponding to the second pixel electrode 147. $CGS_A$ and $CGS_B$ denote capacitances of capacitors formed by overlapping the gate insulation layer 120 disposed between the gate electrode and the source electrode corresponding to the first pixel electrode 145 and second pixel electrode 147, respectively.

As shown in Equations 1 to 4, the first storage capacitor $CST_A$ formed in correspondence with the first pixel electrode 145 may be smaller than the second storage capacitor $CST_B$ formed in correspondence with the second pixel electrode 147, so that a first difference voltage $\Delta$V1 is larger than a second difference voltage $\Delta$V2. Thus, a size of the first boosting electrode 10 may be smaller than a size of the second boosting electrode 30, and the first pixel voltage VP is therefore smaller than the second pixel voltage VP'.

However, the first storage capacitor $CST_A$ is smaller than the second storage capacitor $CST_B$, and the first kickback voltage $\Delta$Vk1 corresponding to the first pixel electrode 145 is therefore larger than the second kickback voltage $\Delta$Vk2 corresponding to the second pixel electrode 147. To improve flicker, e.g., to substantially reduce flicker, an amplitude of the first kickback voltage $\Delta$Vk1 and an amplitude of the second kickback voltage $\Delta$Vk2 are substantially the same, and a parasitic capacitor $CGS_A$ between the first gate electrode and the source electrode of the first pixel electrode 145 are smaller than a parasitic capacitor $CGS_B$ between a second gate electrode and source electrode of the second pixel electrode 147.

Alternatively, the first liquid crystal capacitor $CLC_A$ corresponding to the first pixel electrode 145 may be larger than a second liquid crystal capacitor $CLC_B$ corresponding to the second pixel electrode 147 so that a first difference voltage $\Delta$V1 may be greater than a second difference voltage $\Delta$V2. In an exemplary embodiment, the first pixel electrode 145 is smaller than the second pixel electrode 147, e.g., the first pixel electrode 145 has a reduced outline relative to the second pixel electrode 147, so that a first pixel voltage VP may be smaller than the second pixel voltage VP'. In an exemplary embodiment, a size of the second pixel electrode 147 is reduced with respect to an area in which the light-blocking pattern BM is covered, so that a transmissivity loss is substantially reduced and/or effectively prevented.

Referring again to FIGS. 1 to 4 and 5A, the data signal DS is boosted to a first pixel voltage VP by a first boosting signal VCST1.

As described in greater detail above, when the gate signal GS is applied to the control electrode CE of the first switching element T1, the data signal DS applied to an input electrode IE of the first switching element T1 is applied to the first output electrode VP1.

The first boosting line BL1 is synchronized with the data signal DS to receive the first boosting signal VCST1. A voltage level of the first boosting signal VCST1 is substantially greater than a common voltage level VCOM applied to the common electrode 240. Accordingly, the data signal DS may be boosted to the first pixel voltage VP by the first storage capacitor $CST_A$ formed from the first output electrode VP1 and the boosting line BL to be applied to the first pixel electrode 145.

As the first pixel voltage VP is applied to the first pixel electrode 145, an arrangement of the liquid crystal molecules 305 of the liquid crystal layer 300 in the first pixel electrode 145 is altered to display a desired image.

Referring again to FIGS. 1 to 4 and 5B, the data signal DS is boosted to a second pixel voltage VP' by a second boosting signal VCST2.

In an exemplary embodiment, the data signal DS may be boosted to the first pixel voltage VP by the second boosting line BL2 when the data signal DS is simultaneously boosted to the second pixel voltage VP'.

When the gate signal GS is applied to the control electrode CE of the second switching element T2, the data signal DS applied to an input electrode IE of the second switching element is applied to the second output electrode VP2.

The second boosting signal VCST2 is applied to the second boosting line BL2. A voltage level of the second boosting signal VCST2 may be greater than the common voltage level VCOM applied to the common electrode 240. Accordingly, the data signal DS may be boosted to the second pixel voltage VP' by the second storage capacitor $CST_B$ formed from the second output electrode VP2 and the second boosting line BL2 to be applied to the second pixel electrode 147.

Figure 6:
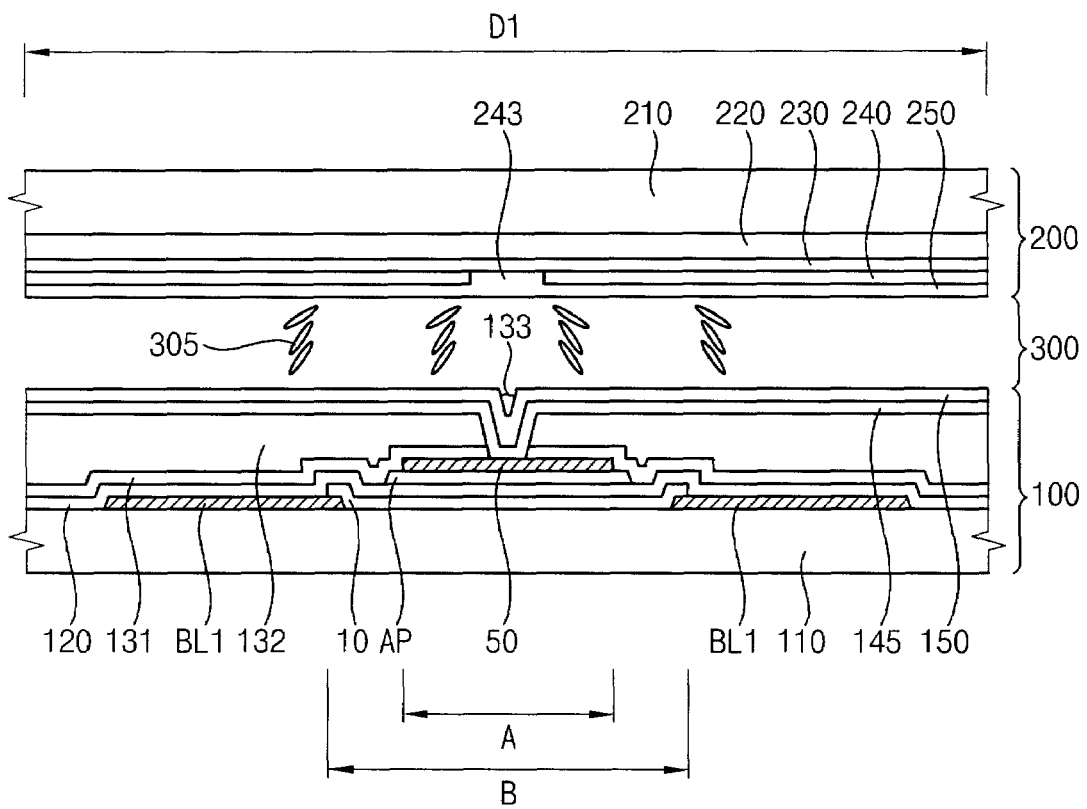
FIG. 6 is a partial cross-sectional view taken along line III-III' of FIG. 1.
Figure 7:
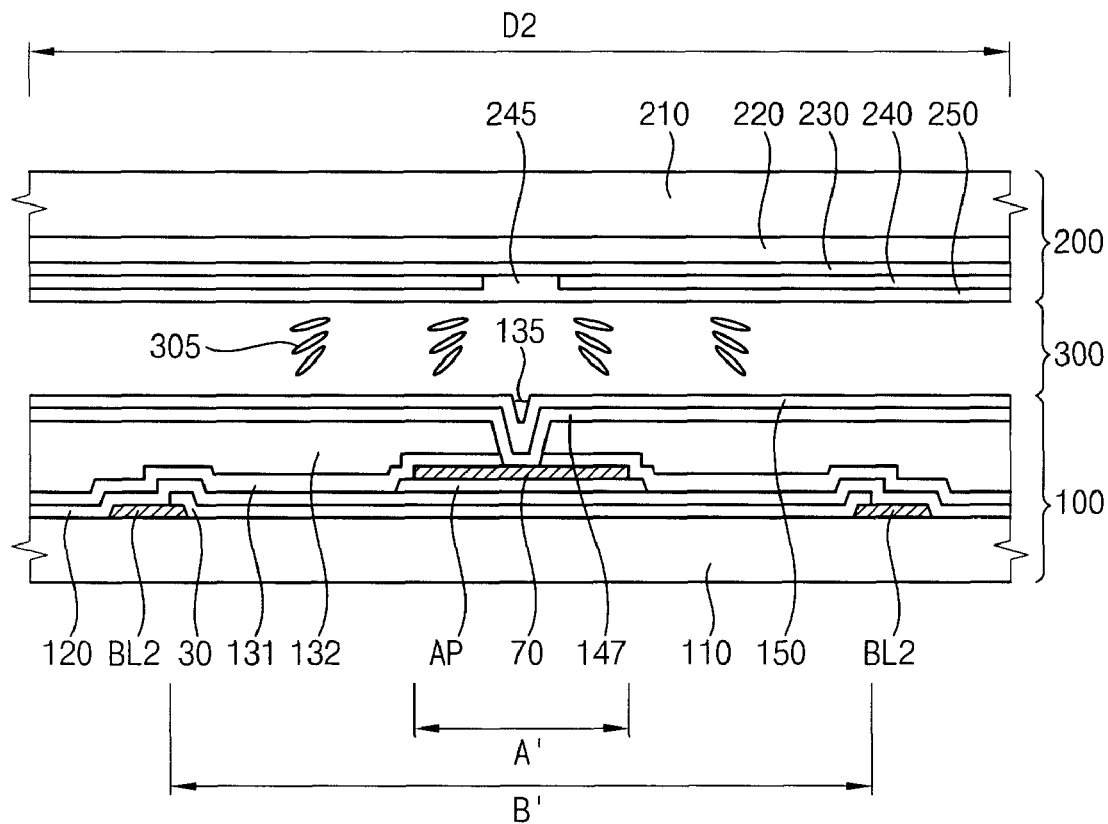
FIG. 7 is a partial cross-sectional view taken along line IV-IV' of FIG. 1.

FIG. 6 is a partial cross-sectional view taken along line III-III' of FIG. 1. FIG. 7 is a partial cross-sectional view taken along line IV-IV' of FIG. 1.

The display device according to an exemplary embodiment described with reference to FIGS. 6 and 7 is substantially the same as the display device described in greater detail above with reference to FIG. 3. Accordingly, the same reference numerals will be used to refer to the same or like elements, and any repetitive detailed explanation will be omitted.

Referring to FIGS. 3, 6 and 7, the first boosting electrode 10, the gate insulation layer 120, the active pattern AP, the first contact electrode 50 and the first pixel electrode 145 define the first storage capacitor $CLC_A$. The second boosting electrode 30, the gate insulation layer 120, the active pattern AP, the second contact electrode 70 and the second pixel electrode 147 define the second storage capacitor $CLC_B$.

In an exemplary embodiment, a width A of the first contact electrode 50 may be about 8 μm. Moreover, a width A' of the second contact electrode 70 may be about 18 μm.

However, a width B of the first boosting electrode 10 and a width B' of the second boosting electrode 30 may not be the same as the widths A and A'. Specifically, the width B of the first boosting electrode 10 is controlled such that the capacitance of the first storage capacitor $CST_A$ is controlled. Moreover, the width B' of the second boosting electrode 30 is controlled such that the capacitance of the second storage capacitor $CST_B$ is controlled.

Referring again to FIGS. 4, 6 and 7, the first storage capacitor $CLC_A$ is smaller than the second storage capacitor $CST_B$, and the first difference voltage ΔV1 may be smaller than the second difference voltage ΔV2. Thus, an amplitude of the first pixel voltage VP may be smaller than an amplitude of the second pixel voltage VP'. More particularly, a width B of the first boosting electrode 10 is smaller than a width B' of the second boosting electrode 30, so that the amplitude of the first pixel voltage VP may be smaller than that of the second pixel voltage VP'. As a result, the amplitude of the first pixel voltage VP is less than the amplitude of the second pixel voltage VP', so that the liquid crystal molecules 305 of the first domain D1 area may be inclined differently than the liquid crystal molecules 305 of the second domain D2 area.

Moreover, the first contact electrode 50 and the second contact electrode 70 are formed of opaque metal material having a fixed size, and the size of the first boosting electrode 10 and the second boosting electrode 30 is varied, so that capacitances of the first storage capacitor $CST_A$ and the second storage capacitor $CST_B$ may be increased to substantially improve an aperture ratio.

Figure 8A:
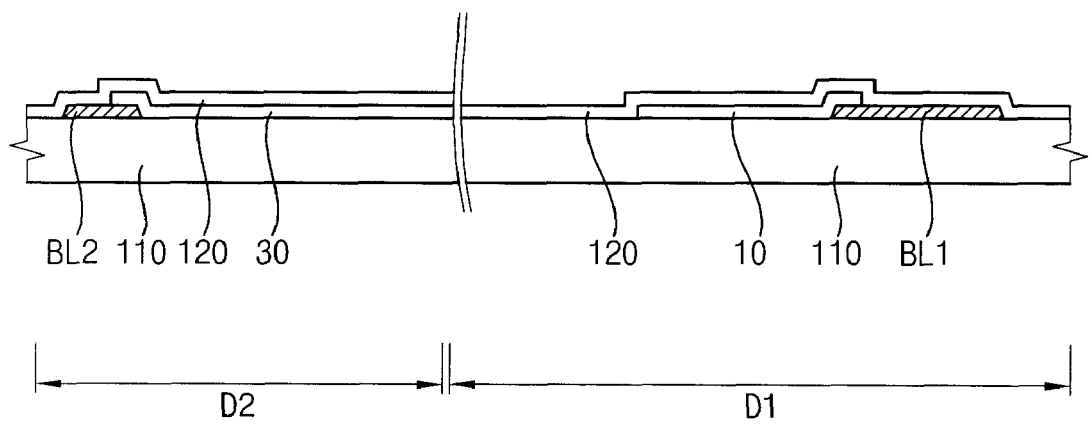
FIGS. 8A to 8C are partial cross-sectional views illustrating an exemplary embodiment of a process for manufacturing a display substrate according to the present invention.
Figure 8B:
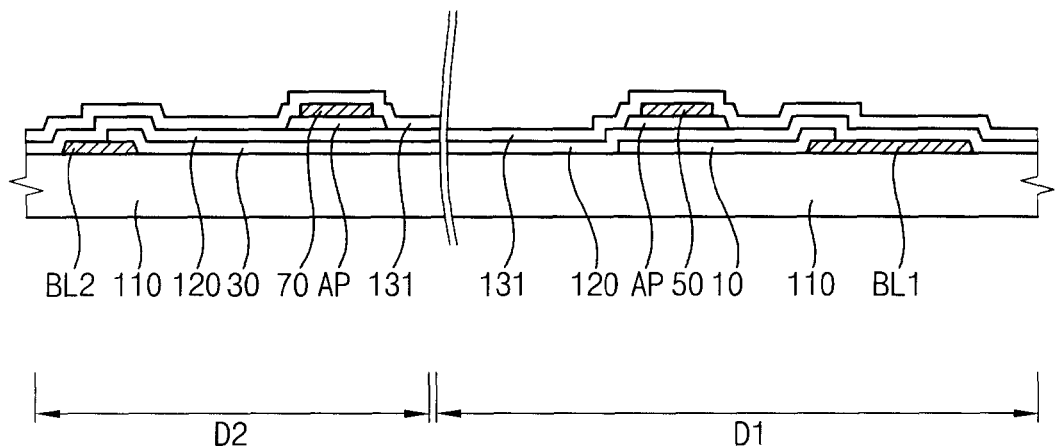
Figure 8C:
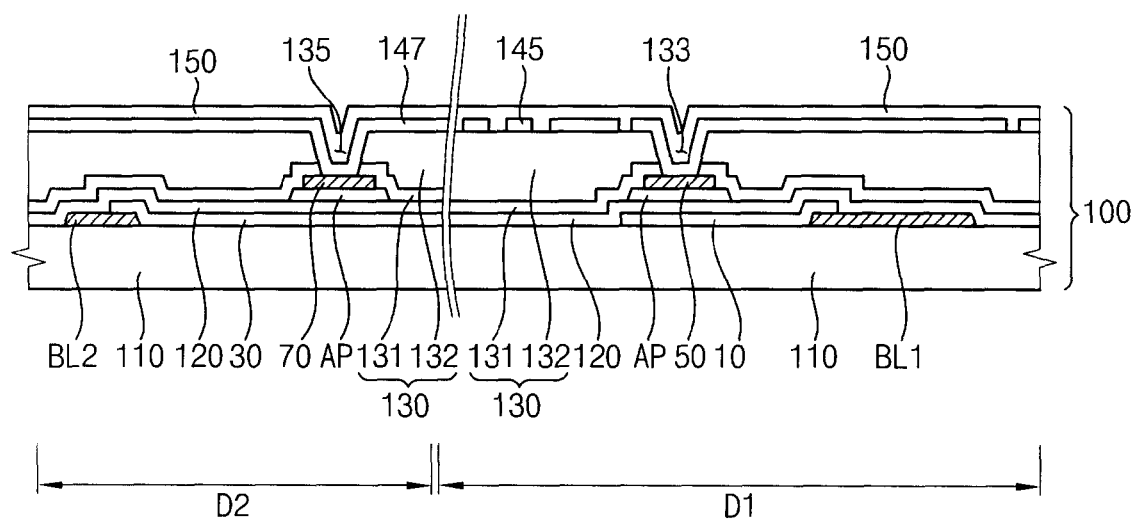

FIGS. 8A to 8C are partial cross-sectional views illustrating an exemplary embodiment of a process for manufacturing display substrate according to the present invention. The exemplary embodiment of a display device described with reference to FIGS. 8A to 8C is substantially the same as the display device described in greater detail above with reference to FIG. 3. Accordingly, the same reference numerals will be used to refer to the same or like elements, and any repetitive detailed description thereof will be omitted.

Referring to FIGS. 1, 3 and 8A, a gate metal layer is formed on the base substrate 110. The gate metal layer is patterned to form a gate metal pattern having the first boosting line BL1 and the second boosting line BL2 corresponding to the first domain D1 area and the second domain D2 area, respectively, and the gate electrode GE of the transistor TFT as shown in FIG. 2.

A transparent metal layer is formed on the gate metal pattern. The transparent metal layer is patterned to form the first boosting electrode 10 and the second boosting electrode 30. A portion of the first boosting electrode 10 overlaps the first boosting line BL1, and a portion of the second boosting electrode 30 overlaps with the second boosting line BL2.

The gate insulation layer 120 is formed on the first base substrate 110 on which the gate metal pattern and the transparent metal pattern are formed.

Referring to FIGS. 1 to 3, and 8B, the active pattern AP is formed on the base substrate 110 on which the gate insulation layer 120 is formed. A source metal layer is formed on the first base substrate 110 on which the active pattern AP is formed. The source metal layer is patterned to form a source metal pattern including the first data line DL1 and the second data line DL2 as shown in FIG. 1, the source electrode SE, and the first drain electrode DE1 and the second drain electrode DE2. In an exemplary embodiment, the active pattern AP and the source metal pattern are formed using different masks. However, the channel pattern and the source metal pattern may be formed using a same mask. The inorganic insulation layer 131 is formed on the base substrate 110 on which the source metal pattern is formed.

Referring to FIGS. 1 to 3 and 8C, the organic insulation layer 132 is formed on the base substrate 110 on which the inorganic insulation layer 131 is formed. The inorganic insulation layer 131 and the organic insulation layer 132 are etched to form the first contact hole 133 and the second contact hole 135 which expose the first contact electrode 50 and the second contact electrode 70, respectively.

The transparent metal layer is formed on the base substrate 110 on which the first contact hole 133 and the second contact hole 135 are formed. The transparent metal layer may be patterned to form the first pixel electrode 145 and the second pixel electrode 147.

In an exemplary embodiment, the cutting grooves 160 of the first pixel electrode 145 may be formed on the first domain D1 area to define four sub-domains. The cutting grooves 160 may be formed in parallel with each other within a same sub-domain of the four sub-domains. Accordingly, a remaining area of the first pixel electrode 145 excluding the cutting grooves 160 may have a shape in which a plurality of slits is disposed.

Thus, a periphery of the first pixel electrode 145 may be greater than a periphery of the second pixel electrode 147. However, an area of the first pixel electrode 145 may be less than an area of the second pixel electrode 147, as described in greater detail above.

The first pixel electrode 145 and the second pixel electrode 147 contact with the first contact electrode 50 and the second contact electrode 70 through the first contact hole 133 and the second contact hole 135, respectively, so that each of the first pixel electrode 145 and the second pixel electrode 147 is electrically connected to the first drain electrode DE1 and the second drain electrode DE2, e.g., the first output electrode and the second output electrode of the transistor TFT, respectively.

In an exemplary embodiment, the data signal DS is boosted to a first pixel voltage VP by the first boosting signal VCST1 to be applied to the first pixel electrode 145, and the data signal DS is boosted to a second pixel voltage VP' by the second boosting signal VCST2 to be applied to the second pixel electrode 147. Thus, a dual gamma driving method of the first pixel electrode 145 and the second pixel electrode 147 is implemented, and a off-axis image quality is thereby substantially improved.

Moreover, the opposite substrate 200, which is disposed on the first pixel electrode 145 and the second pixel electrode 147, has the first common electrode hole 243 and the second common electrode hole 245 formed thereon, and the liquid crystal layer 300 does include a reactive mesogen, but alternative exemplary embodiments are not limited thereto. Accordingly a process of irradiating ultraviolet ("UV") light may be omitted, and a process of manufacturing the display device according to an exemplary embodiment is thereby substantially simplified.

Figure 9:
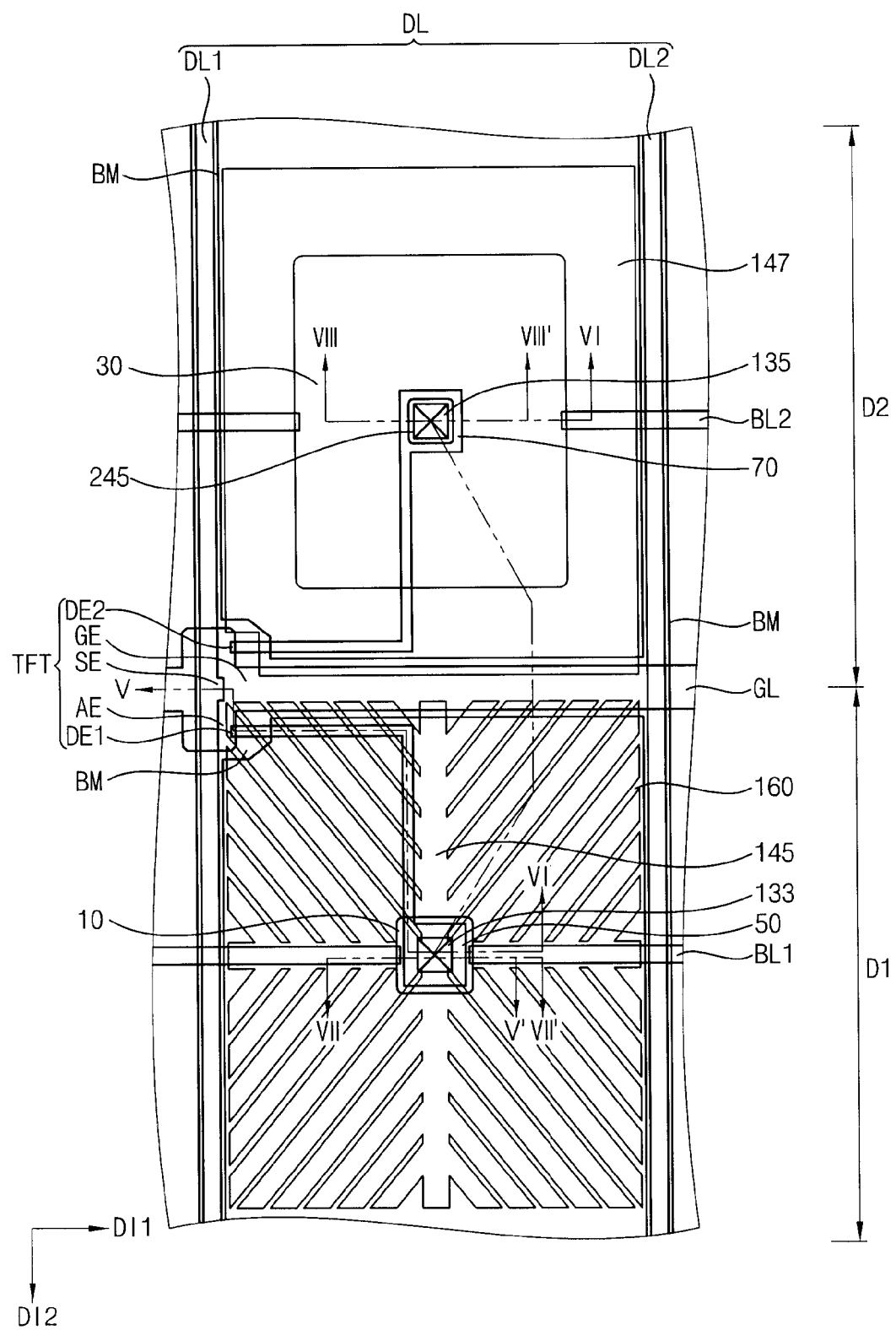
FIG. 9 is a plan view of an alternative exemplary embodiment of a display device according to the present invention.
Figure 10:
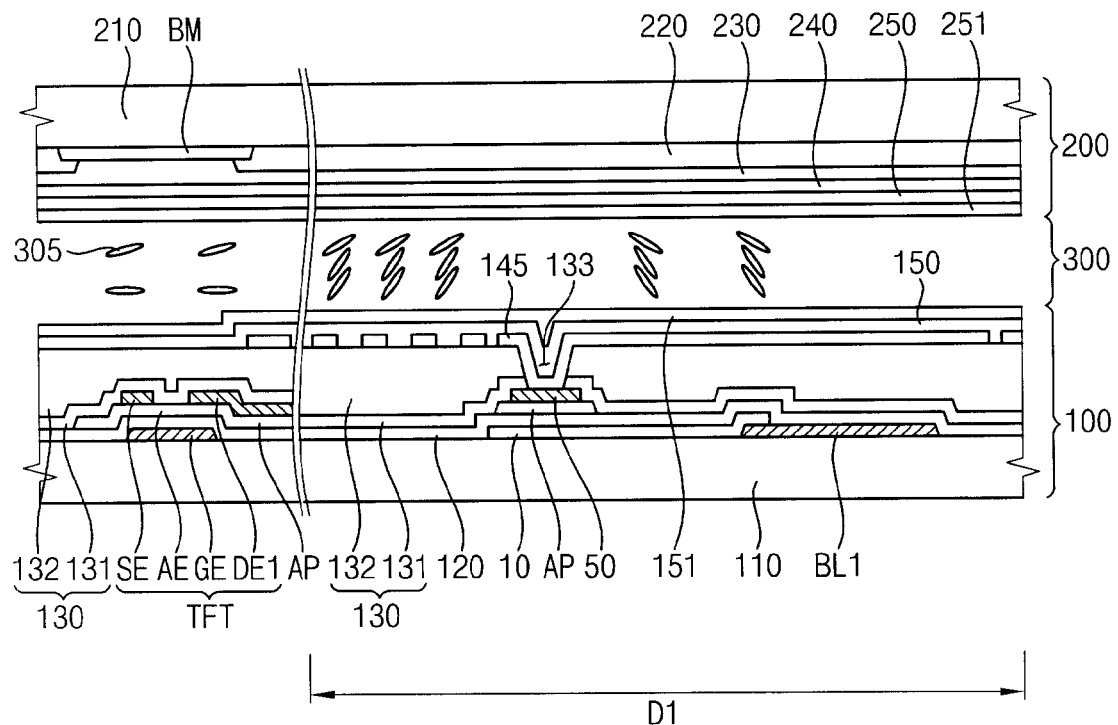
FIG. 10 is a partial cross-sectional view taken along line V-V' of FIG. 9.
Figure 11:
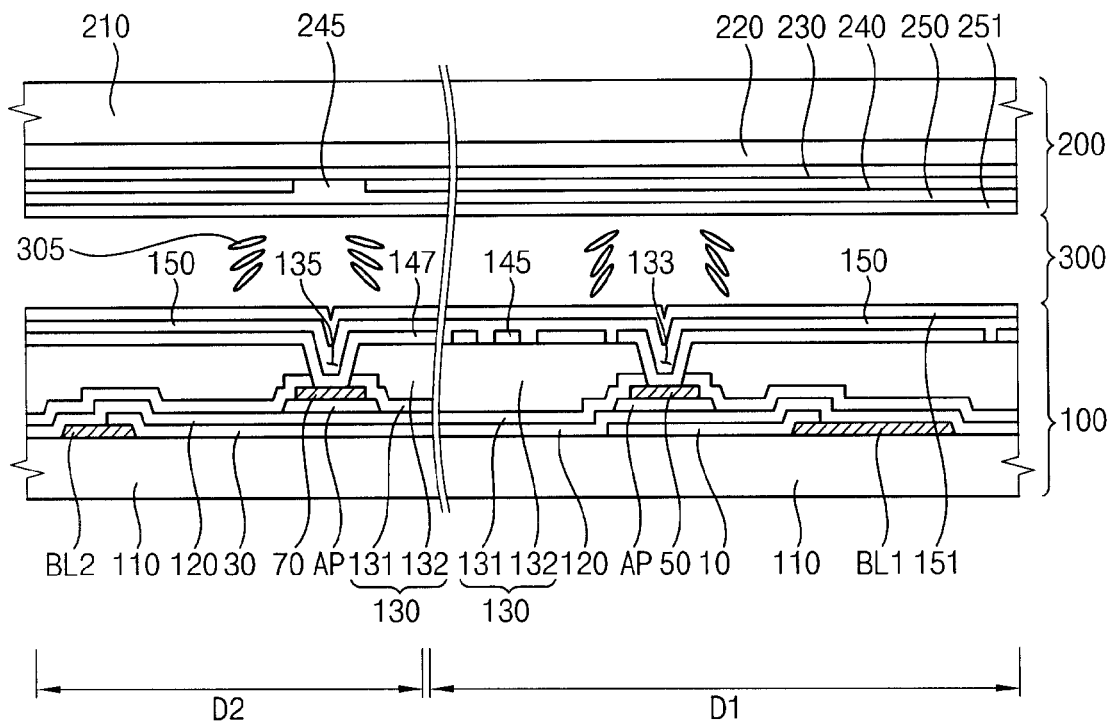
FIG. 11 is a partial cross-sectional view taken along line VI-VI' of FIG. 9.

FIG. 9 is a plan view of an alternative exemplary embodiment of a display device according to the present invention. FIG. 10 is a partial cross-sectional view taken along line V-V' of FIG. 9. FIG. 11 is a partial cross-sectional view taken along line VI-VI' of FIG. 9.

The display device according to an exemplary embodiment is substantially the same as the display device described in greater detail above with reference to FIGS. 1 to 4, except that a common electrode hole is not formed corresponding to a first domain D1 area in a common electrode 240 of the opposite substrate 200, and a liquid crystal layer 300 includes a reactive mesogen. Accordingly, the same reference numerals will be used to refer to the same or like elements as those described above, and any repetitive detailed description thereof will be omitted.

Referring to FIGS. 9 to 11, the common electrode 240 is disposed on the overcoating layer 230. The common electrode 240 includes a common electrode hole 245 corresponding to the second contact hole 135. When an electric field is applied, liquid crystal molecules 305 of the liquid crystal layer 300 are aligned toward the common electrode hole 245 by the common electrode hole 245.

The liquid crystal layer 300 of the display device according to an exemplary embodiment includes a reactive mesogen ("RM") instead of a common electrode hole 243 corresponding to the first contact hole 133 of the display device according to an alternative exemplary embodiment described in greater detail above. When light is irradiated to the liquid crystal layer 300, a first RM curing layer 151 and a second RM curing layer 251 are formed, and thereby fix the liquid crystal molecules 305 adjacent to the lower alignment layer 150 and the upper alignment layer 250, respectively, in a horizontal direction. Moreover, when light is irradiated to a central portion of the liquid crystal layer 300, the liquid crystal molecules 305 therein may be aligned in a vertical direction, as shown in FIG. 10.

Due to the abovementioned alignments of the liquid crystal molecules 305, a response time in which the liquid crystal molecules 305 are aligned in response to a driving signal is substantially enhanced. It will be noted that the alignment directions of the liquid crystal molecules 305 may be varied in alternative exemplary embodiments, so that a viewing angle of the display device is substantially enhanced.

In an exemplary embodiment, electrical connections of the display device, as illustrated in FIG. 9, are substantially the same as in the display device according to the exemplary embodiment shown in FIG. 5, and a repetitive detailed description thereof will be omitted.

In addition, in the exemplary embodiment shown in FIG. 9, relationships between signals and voltages applied to the display device shown in FIG. 9 are substantially the same as in the display device shown in FIGS. 5A and 5B, and thus any repetitive detailed description thereof will be omitted.

Figure 12:
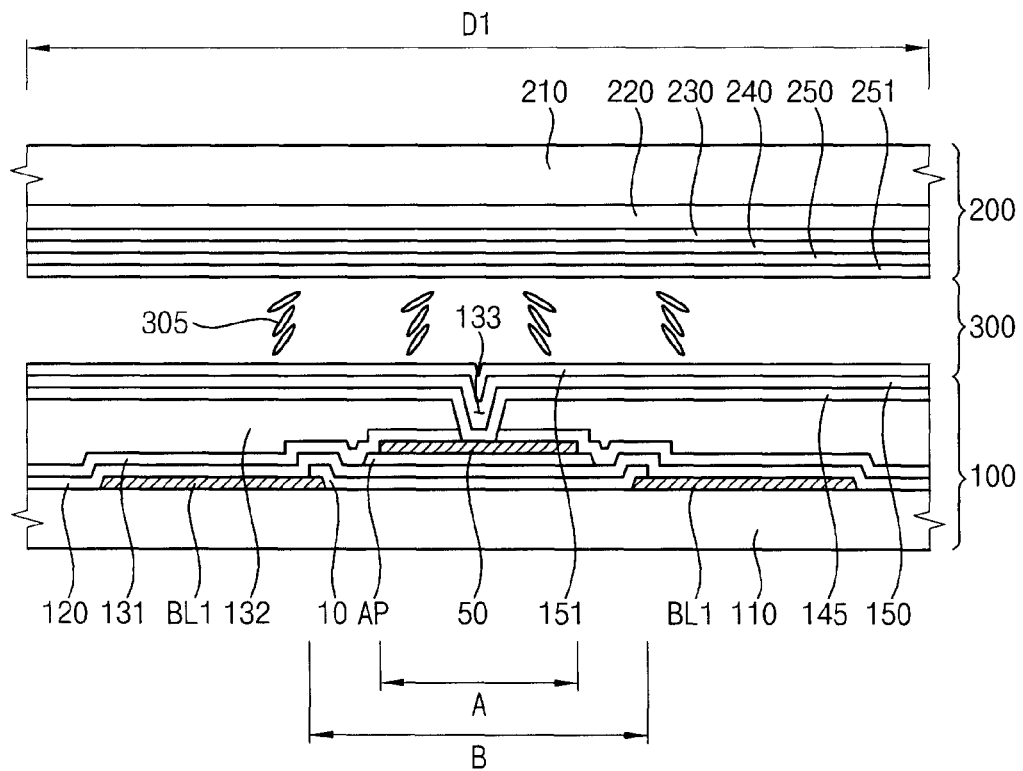
FIG. 12 is a partial cross-sectional view taken along line VII-VII' of FIG. 9.
Figure 13:
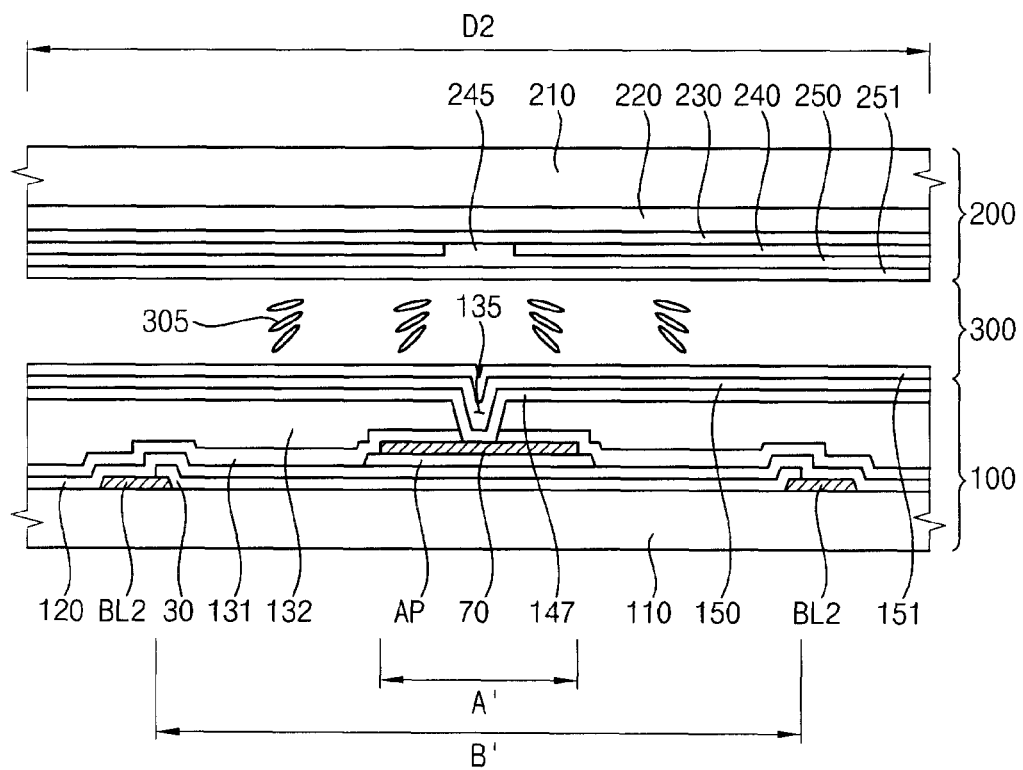
FIG. 13 is a partial cross-sectional view taken along line VIII-VIII' of FIG. 9.

FIG. 12 is a partial cross-sectional view taken along line VII-VII' of FIG. 9. FIG. 13 is a partial cross-sectional view taken along line VIII-VIII' of FIG. 9.

The display device according to an exemplary embodiment shown in FIG. 12 is substantially the same as the display device described in greater detail above with reference to FIGS. 6 and 7, except that a common electrode hole is not formed corresponding to a first domain D1 area in a common electrode 240 of the opposite substrate 200, and a liquid crystal layer 300 includes a reactive mesogen. Thus, the same reference numerals will be used to refer to the same or like elements, and any repetitive detailed description will be omitted.

Referring to FIGS. 12 and 13, the common electrode 240 is disposed on the overcoating layer 230. The common electrode 240 includes a common electrode hole 245 corresponding to the second contact hole 135. When an electric field is applied, liquid crystal molecules 305 of the liquid crystal layer 300 are aligned toward the common electrode hole 245 by the common electrode hole 245.

The liquid crystal layer 300 of the display device according to Embodiment 2 includes an RM instead of a common electrode hole 243 corresponding to the first contact hole 133. When light is irradiated onto the liquid crystal layer 300, a first RM curing layer 151 and a second RM curing layer 251 are formed, which fix the liquid crystal molecules 305 adjacent to the lower alignment layer 150 and the upper alignment layer 250, respectively, in a horizontal direction. Moreover, when the light is irradiated onto a central portion of the liquid crystal layer 300, the liquid crystal molecules 305 therein are aligned in a vertical direction.

Due to the alignment of the liquid crystal molecules 305, a response time in which the liquid crystal molecules 305 are aligned in response to a driving signal is substantially enhanced. Moreover, the alignment directions of the liquid crystal molecules 305 may be varied, and a viewing angle of the display device according to an exemplary embodiment is thereby substantially enhanced.

In an exemplary embodiment, a process of manufacturing the display substrate of the display device is substantially the same as described in greater detail above with reference to FIGS. 8A to 8C, and thus any repetitive detailed description thereof will be omitted.

In exemplary embodiment, the opposite substrate 200 is disposed on the second pixel electrode 147 having slits and includes the common electrode hole 245, and the alignment directions of the liquid crystal molecules 305 may therefore be varied, and a viewing angle of the display device is therefore substantially enhanced. In addition, the liquid crystal layer 300 according to an exemplary embodiment includes a reactive mesogen, and the viewing angle of the display device is therefore further enhanced.

Figure 14:
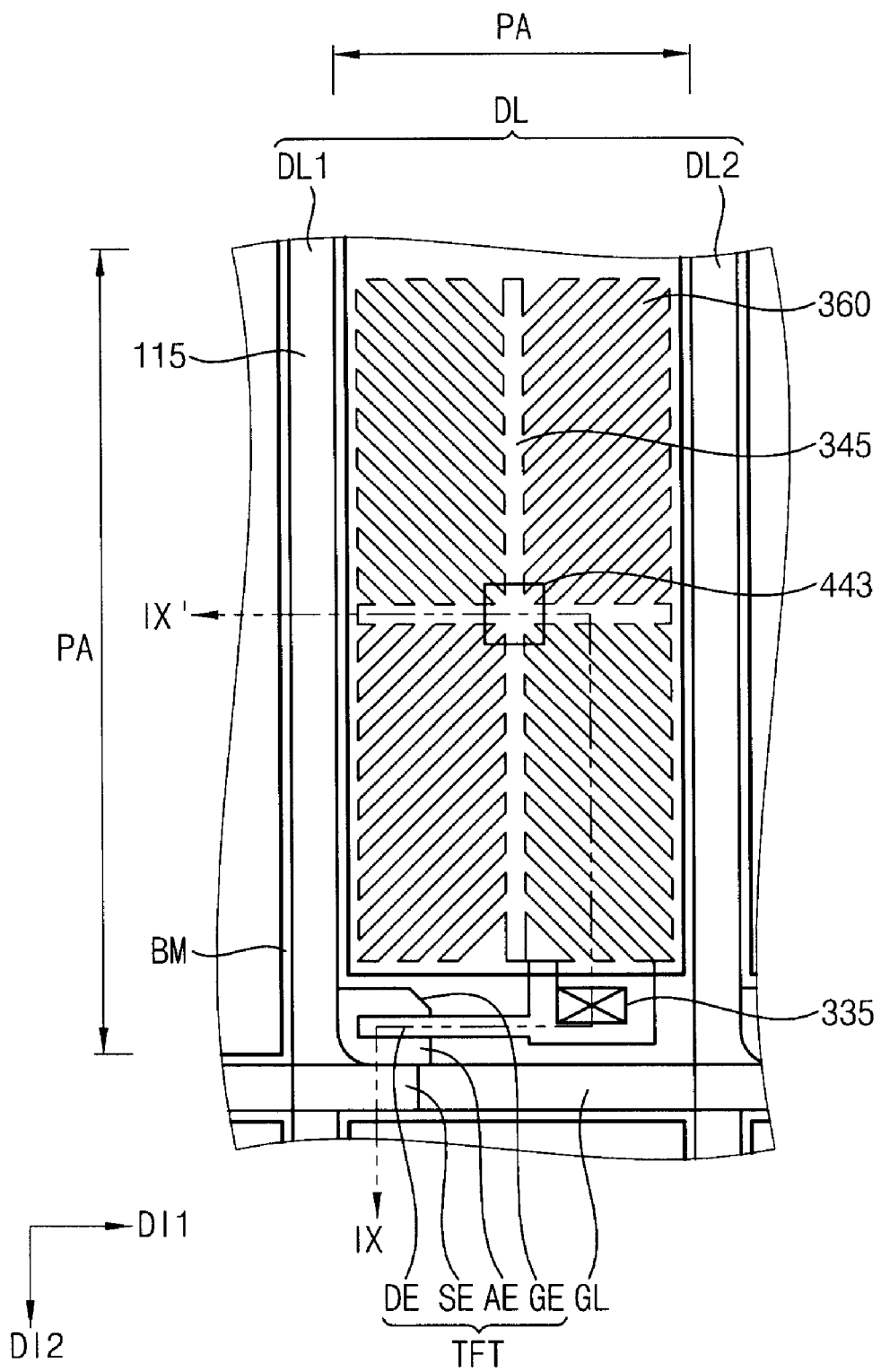
FIG. 14 is a plan view of another alternative exemplary embodiment of a display device according to the present invention.
Figure 15:
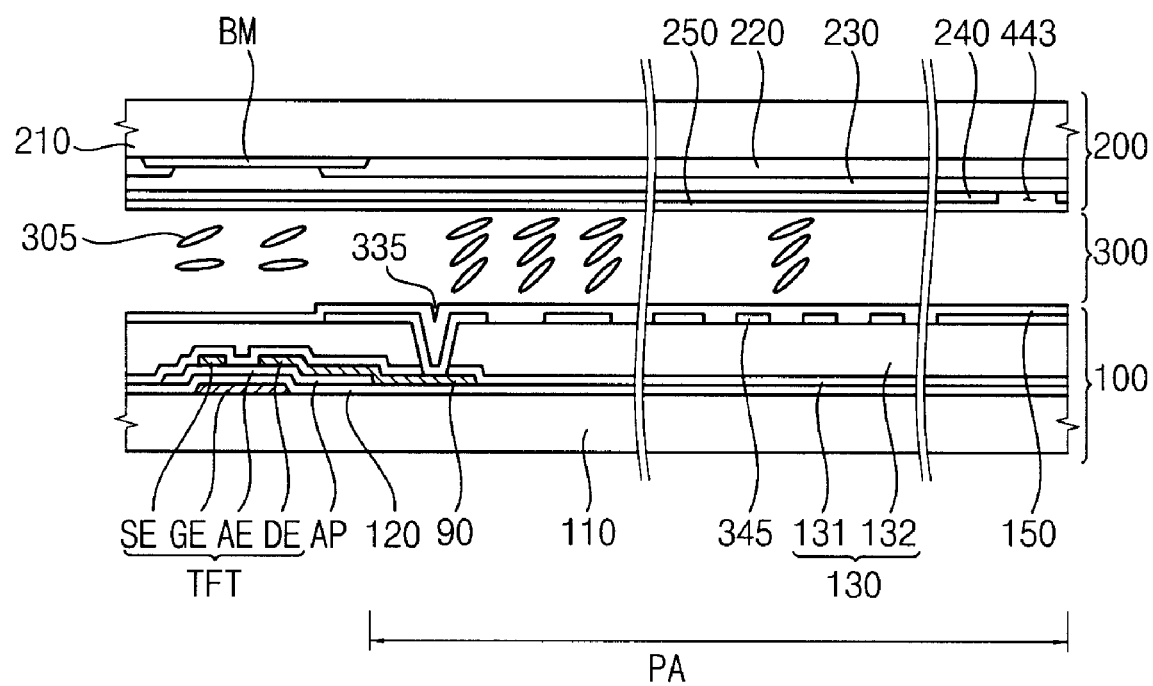
FIG. 15 is a partial cross-sectional view taken along line IX-IX' of FIG. 14.

FIG. 14 is a plan view of another alternative exemplary embodiment of a display device according to the present invention. FIG. 15 is a partial cross-sectional view taken along line IX-IX' of FIG. 14.

The display device according to an exemplary embodiment is substantially the same as the display device described in greater detail above with reference to FIGS. 1 to 3 except that the display substrate 100 is not divided into a first domain D1 and a second domain D2, and boosting lines and boosting electrodes for separately driving the first domain D1 and the second domain D2 are therefore not required. Thus, the same reference numerals will be used to refer to the same or like elements as those described above, and any repetitive detailed description thereof will be omitted.

Referring to FIGS. 14 and 15, a display device according to an exemplary embodiment includes a display substrate 100, an opposite substrate 200 and a liquid crystal layer 300.

The display substrate 100 includes a base substrate 10 having a pixel area defined thereon. A gate line GL, a gate insulation layer 120, and data lines DL including a first data line DL1 and a second data line DL2, a data insulation layer 130, a contact electrode 90, a pixel electrode 345, a transistor TFT and a lower alignment layer 150 are disposed on the first base substrate 110

The gate line GL is disposed on the base substrate 110 and extends in a first direction DI1.

The gate insulation layer 120 is disposed on the first base substrate 110 to cover the gate line GL and a gate electrode GE extends from the gate line GL.

The first data line DL1 and the second data line DL2 are disposed on the gate insulation layer 120 and extend in a second direction DI2 crossing the first direction DI1. In an exemplary embodiment, the first direction DI1 and the second direction DI2 may be substantially perpendicular to each other.

The transistor TFT includes a gate electrode GE, an active electrode AE, a source electrode SE and a drain electrode DE.

The gate electrode GE may be a portion of the gate line GL. The active electrode AE may be disposed on the gate insulation layer 120 to overlap the gate electrode GE.

The source electrode SE may diverge from, e.g., project from, the data line DL.

The drain electrode DE may be spaced apart from the source electrode SE.

The drain electrode DE may extend to electrically connect to the contact electrode 90.

The contact electrode 90 is disposed on the gate insulation layer 120 within a unit pixel. The contact electrode 90 may be, for example, a substantially rectangular shape.

The data insulation layer 130 is disposed on the gate insulation layer 120 to cover the first data line DL1 and the second data line DL2, the source electrode SE and drain electrode DE and the contact electrode 90. In an exemplary embodiment, the data insulation layer 130 includes an inorganic insulation layer 131 and an organic insulation layer 132. The inorganic insulation layer 131 is disposed over the organic insulation layer 132.

A contact hole 335 is formed through the data insulation layer 130 corresponding to an upper portion of the contract electrode 90.

The pixel electrode 345 is disposed on the data insulation layer 130. The pixel electrodes 345 include a metal pattern formed from a transparent metal layer, for example.

The pixel electrode 345 contacts with the contact electrode 90 extending from the drain electrode DE of the transistor TFT, and includes a plurality of cutting grooves 360 which define the pixel area PA.

A peripheral area of the second pixel electrode 147 may include a closed-loop shape, e.g., a substantially rectilinear shape without protrusions extending outward from sides thereof. In contrast, the cutting grooves 160 of the plurality of cutting grooves 160 of the first pixel electrode 145 extend outward from the first pixel electrode 145 to form openings about a peripheral area thereof.

The cutting grooves 160 of the pixel electrode 345 are disposed in the pixel area PA, and define four sub-domains in the pixel area PA. The cutting grooves 360 in a given sub-domain of the four sub-domains are disposed substantially in parallel with each other. Accordingly, a remaining area of the pixel electrode 345 excluding the cutting grooves 160 may include a shape in which slits are disposed.

In addition, the slits may have a shape which extends toward a center portion of the pixel electrode 345. The slits may be substantially parallel to the first direction DI1 or, alternatively, may be substantially parallel to the second direction DI2.

The lower alignment layer 150 is disposed on the first base substrate 110 having the pixel electrode 345. Liquid crystal molecules 305 of the liquid crystal layer 300 are aligned in a vertical direction, e.g., a direction toward an opposite substrate 200 from the display substrate 100.

The opposite substrate 200 may face the display substrate 100.

The opposite substrate 200 may include an upper substrate 210, a light-blocking pattern BM (e.g., a black matrix pattern BM), a color filter pattern 220, an overcoating layer 230, a common electrode 240 and upper alignment layer 250.

The light-blocking pattern BM may be disposed on the upper substrate 201 corresponding to the first data line DL1 and the second data line DL2 and the transistor TFT. Accordingly, the color filter pattern 220 may be disposed in a pixel area PA in which light is not blocked.

The common electrode 240 may be disposed on the overcoating layer 230. The common electrode 240 may include a common electrode hole 443 at a center portion of the common electrode 240. When an electric field is applied, the liquid crystal molecules 305 of the liquid crystal layer 300 are aligned toward the common electrode hole 443 by the common electrode hole 443.

In an exemplary embodiment, the common electrode hole 443 is disposed on a center portion of the pixel area PA to have a substantially rectangular shape. Alternatively, the common electrode hole 443 may have a cross shape, a circular shape or a cross shape inclined by an angle of about 45 degrees, but alternative exemplary embodiments are not limited thereto.

The upper alignment layer 250 may be disposed on the common electrode 240 to vertically align the liquid crystal molecules 205 of the liquid crystal layer 300.

The liquid crystal layer 300 is interposed between the display substrate 100 and the opposite substrate 200. An arrangement of the liquid crystal molecules 305 of the liquid crystal layer 300 is changed by an electric field applied between the pixel electrode 345 and the common electrode 240. As a result, a light transmissivity of the liquid crystal layer 300 is changed depending on a strength of the electric field.

An exemplary embodiment of a process of manufacturing the display substrate of the display device described above is substantially the same as the process of manufacturing a display substrate of the display device described in greater detail above with reference to FIGS. 8A to 8C, except that the display substrate 100 is not divided into a first domain D1 and a second domain D2. Accordingly, boosting lines and boosting electrodes for separately driving the first domain D1 and the second domain D2 are not required.

Accordingly, the same reference numerals will be used to refer to the same or like elements as those described above, and any repetitive detailed description thereof will be omitted.

In an exemplary embodiment, the opposite substrate 200 is disposed on the pixel electrode 345 having slits and includes the common electrode holes 443, and a viewing angle of the display device is thereby substantially enhanced. In addition, the liquid crystal layer 300 according to an exemplary embodiment may not include a reactive mesogen, and a UV irradiating process may therefore be omitted, so that a process of manufacturing the display device according to an exemplary embodiment is substantially simplified.

According to exemplary embodiments as described herein, a hybrid structure is provided wherein the hybrid structure simultaneously uses a circular polarization mPVA mode and an SVA mode, and a off-axis image quality is thereby substantially improved with respect to the circular polarization mPVA, while transmissivity is substantially enhanced. In addition, dual gamma driving of a first pixel electrode and a second pixel electrode through a first boosting signal and a second boosting signal is utilized, and a off-axis image quality is thereby further improved.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A display substrate comprising:
    a gate line;
    a data line crossing the gate line;
    a transistor connected to the gate line and the data line;
    a first pixel electrode connected to a first output electrode of the transistor, the first pixel electrode comprising cutting grooves disposed thereon to define a first domain;
    a second pixel electrode connected to a second output electrode of the transistor,
    a first boosting electrode overlapping the first output electrode of the transistor to define a first storage capacitor; and
    a second boosting electrode overlapping the second output electrode of the transistor to define a second storage capacitor.

2. The display substrate of claim 1, wherein
    the gate line is disposed between the first pixel electrode and the second pixel electrode, and
    the first pixel electrode and the second pixel electrode simultaneously receive a voltage through the transistor.

3. The display substrate of claim 1, wherein a peripheral area of the second pixel electrode defines a closed-loop shape.

4. The display substrate of claim 1, wherein
    the cutting grooves are disposed in the first domain to define four groups, and
    the cutting grooves in a same group of the four groups are aligned substantially in parallel with each other.

5. The display substrate of claim 1, wherein the first boosting electrode and the second boosting electrode comprise a transparent material.

6. The display substrate of claim 1, wherein an area of the first boosting electrode is less than an area of the second boosting electrode.

7. The display substrate of claim 1, further comprising:
    a first boosting line disposed substantially in parallel with the gate line and connected to the first boosting electrode; and
    a second boosting line disposed substantially in parallel with the gate line and connected to the second boosting electrode.

8. The display substrate of claim 1, wherein a periphery of the first pixel electrode is larger than a periphery of the second pixel electrode.

9. A method of manufacturing a display substrate, the method comprising:
    forming a transistor connected to a gate line and a data line crossing the gate line;
    forming a first pixel electrode connected to a first output electrode of the transistor;
    forming a second pixel electrode connected to a second output electrode of the transistor;
    forming a first boosting electrode overlapping the first output electrode of the transistor to define a first storage capacitor; and
    forming a second boosting electrode overlapping the second output electrode of the transistor to define a second storage capacitor,
    wherein the first pixel electrode includes cutting grooves formed thereon to define a first domain.

10. The method of claim 9, further comprising:
    forming a first boosting line and a second boosting line to provide a boosted voltage level to the first pixel electrode and the second pixel electrode, respectively;
    forming the gate line and a gate electrode of the transistor by patterning a first metal layer deposited on a base substrate; and
    forming the first boosting electrode and the second boosting electrode connected to the first boosting line and the second boosting line, respectively, by patterning a transparent metal layer deposited on the base substrate on which the first boosting line, the second boosting line, the gate electrode and the gate line are formed.

11. The method of claim 10, wherein an area of the first boosting electrode is less than an area of the second boosting electrode.

12. A display device comprising:
    a display substrate comprising:
    a gate line;
    a data line crossing the gate line;
    a transistor connected to the gate line and the data line;
    a first pixel electrode connected to a first output electrode of the transistor, the first pixel electrode having cutting grooves disposed thereon for defining a first domain;
    a second pixel electrode connected to a second output electrode of the transistor;
    a first boosting electrode overlapping the first output electrode of the transistor to define a first storage capacitor;
    a second boosting electrode overlapping the second output electrode of the transistor to define a second storage capacitor
    an opposite substrate facing the display substrate; and a liquid crystal layer interposed between the display substrate and the opposite substrate.

13. The display device of claim 12, wherein the first pixel electrode and the second pixel electrode comprise a first contact hole and a second contact hole, respectively, connected to the first output electrode and the second output electrode, respectively.

14. The display device of claim 13, wherein the opposite substrate comprises a common electrode comprising a first common electrode hole and a second common electrode hole formed therethrough, and corresponding to the first pixel electrode and the second pixel electrode, respectively.

15. The display device of claim 14, wherein the first contact hole and the second contact hole are disposed to overlap the first common electrode hole and the second common electrode hole, respectively.

16. The display device of claim 13, wherein the opposite substrate comprises a common electrode having a common electrode hole formed therethrough and corresponding to the second pixel electrode.

17. The display device of claim 16, wherein the second contact hole is disposed to overlap the common electrode hole.

18. The display device of claim 17, wherein the liquid crystal layer comprises a reactive mesogen.

* * * * *

UNITED STATES PATENT AND TRADEMARK OFFICE
CERTIFICATE OF CORRECTION

PATENT NO. : 8,330,888 B2  
APPLICATION NO. : 12/496747  
DATED : December 11, 2012  
INVENTOR(S) : Jae-Hyun Kim Page 1 of 1

It is certified that error appears in the above-identified patent and that said Letters Patent is hereby corrected as shown below:

Title Page Item (30) Foreign Application Priority Data, insert -- Dec. 12, 2008 (KR) ...... 10-2008-00126717 --; and In the Specification Column 1, line 7, after the word No. delete "2008-126717" and insert -- 10-2008-00126717 --.

Signed and Sealed this  
Seventh Day of July, 2015

Michelle K. Lee  
*Director of the United States Patent and Trademark Office*